(12) United States Patent
Wu et al.

(10) Patent No.: US 11,988,342 B1
(45) Date of Patent: May 21, 2024

(54) LED CIRCUIT BOARD

(71) Applicants: Qingbiao Wu, Fujian (CN); Linlin Wu, Fujian (CN)

(72) Inventors: Qingbiao Wu, Fujian (CN); Linlin Wu, Fujian (CN)

( * ) Notice: Subject to any disclaimer, the term of this patent is extended or adjusted under 35 U.S.C. 154(b) by 0 days.

(21) Appl. No.: 18/226,272

(22) Filed: Jul. 26, 2023

(30) Foreign Application Priority Data

Jun. 20, 2023 (CN) .......................... 202321580247.6

(51) Int. Cl.
*F21K 9/238* (2016.01)
*F21K 9/232* (2016.01)
*F21Y 115/10* (2016.01)

(52) U.S. Cl.
CPC .............. *F21K 9/238* (2016.08); *F21K 9/232* (2016.08); *F21Y 2115/10* (2016.08)

(58) Field of Classification Search
CPC ......... F21K 9/238; F21K 9/232; H05B 45/00; H05K 1/00
See application file for complete search history.

(56) References Cited

U.S. PATENT DOCUMENTS 11,125,430 B1 * 9/2021 Wu .......................... F21V 17/12

FOREIGN PATENT DOCUMENTS

WO    WO-2017016863 A1 *  2/2017 ............... F21K 9/00

* cited by examiner

*Primary Examiner* — Karabi Guharay

(57) ABSTRACT

An LED circuit board that includes an insulation board provided with connecting holes and a holding column, and at least two circuit boards; a first circuit board has a through hole, and a second circuit board has connecting columns; the connecting columns are detachably inserted in the connecting holes; the holding column is detachably inserted in the through hole; the insulation board is made of fire-retardant and fire-resistant plastic material.

9 Claims, 5 Drawing Sheets

LED CIRCUIT BOARD

BACKGROUND OF THE INVENTION

The present utility model relates to the technical field of circuit boards, and in particular to a novel LED circuit board.

LED is usually electrically connected by using a printing circuit board (PCB). The main advantages of using a circuit board are that wiring and assembling errors are greatly reduced, and the level of automation and productivity are enhanced. In addition to the predetermined electronic circuits, a conventional printing circuit board (PCB) also comprises a plurality of electronic components plugged thereon, which release certain thermal energy during operation, and improper heat dissipation will affect the efficiency of the electronic components and even disrupt the operation of the system.

Meanwhile, the rapid development of the electronic industry brings electronic products of smaller size and more functions and chips of higher integration level, resulting in higher energy consumption. In order to enhance the light-emitting quality of the LED circuit board, and prolong the service life of the PCB board, solving the problems of arrangement and heat dissipation of electronic components is a main subject of research in electronic circuit design.

In view of this, the inventor has made an in-depth study of the above problems, which results in the present utility model.

BRIEF SUMMARY OF THE INVENTION

The present utility model is intended to provide a novel LED circuit board characterized by a simple structure, lowered cost, compactness, and enhanced heat dissipation effect.

To achieve the above object, the present invention provides the following technical solutions:

An LED circuit board, comprising at least two circuit boards and an insulation board arranged between two adjacent circuit boards; electronic components are loaded on said at least two circuit boards; said at least two circuit boards are both etched with circuit patterns; said at least two circuit boards comprises a first circuit board disposed above the insulation board and a second circuit board disposed below the insulation board; the insulation board is provided with two connecting holes arranged symmetrically and a holding column arranged between the two connecting holes for convenience of holding; the first circuit board is provided with a through hole passing through the first circuit board at a position corresponding to the holding column; the second circuit board is provided with two connecting columns extending upwards at positions corresponding to the two connecting holes, and the two connecting columns are detachably inserted in the two connecting holes respectively; the holding column is detachably inserted in the through hole; the insulation board is made of fire-retardant and fire-resistant plastic material.

Preferably, the insulation board is provided with a limiting protrusion; a first accommodating space in which some of the electronic components are disposed is defined by a space between a lower surface of the first circuit board, an upper surface of the insulation board, and the limiting protrusion; the first accommodating space is in communication with an external environment.

Preferably, the connecting columns are in interference fit with the connecting holes, wherein outer diameters of the connecting columns are greater than inner diameters of the connecting holes.

Preferably, a second accommodating space in which some of the electronic components are disposed is defined by a space between a lower surface of the insulation board, an upper surface of the second circuit board, and the connecting columns after the connecting columns are inserted into the connecting holes; the second accommodating space is in communication with an external environment.

Preferably, each of the connecting holes comprises a first connecting hole having a columnar shape which a corresponding connecting column is in interference fit with; a second connecting hole in a disc-shape is provided at an opening of the first connecting hole of each of the connecting holes at an end of the first connecting hole facing towards the second circuit board; each first connecting hole is in communication with a corresponding second connecting hole.

Preferably, a copper plating layer is plated on an inner wall of each first connecting hole and/or an inner wall of each second connecting hole.

Preferably, the connecting columns are aluminum heat dissipation columns or tin heat dissipation columns.

Preferably, the electronic components include a first lead, a second lead, at least one light-emitting piece, and a voltage-dividing circuit; the voltage-dividing circuit comprises bridge rectifiers and a resistor assembly; the first lead comprises a first power end configured to be connected with a power supply, and a first connection end connected to the first circuit board; the second lead comprises a second power end configured to be connected to the power supply, and a second connection end connected to the first circuit board; said at least one light-emitting piece is arranged on the lower surface of the second circuit board, and is electrically connected to the second circuit board.

Preferably, said at least one light-emitting piece is a surface mount LED chip, and the LED chip is welded on the lower surface of the second circuit board.

By adopting the above technical solutions, the beneficial effects of the present utility model are as follows:

1. A multi-layer design structure is adopted, which can increase the loading area of the circuit board structure, thereby increasing the number of components that can be loaded on the circuit board structure.

2. By arranging a fire-retardant and fire-resistant plastic material insulation board between two adjacent circuit boards, the operating heat of the components of the first circuit board and the operating heat of the components of the second circuit board can be prevented from being conducted to each other, such that the components arranged on the two circuit boards will not affect each other.

3. Since accommodating spaces for arranging the components are configured between the first circuit board and the insulation board and between the second circuit board and the insulation board respectively, and the accommodating spaces are in communication with the external environment, the operating heat of the components arranged in the accommodating spaces can be quickly dissipated, which greatly enhances the heat dissipation effect of the LED lamp, and prolongs the service life of the LED lamp.

4. The light-emitting piece is connected with the second circuit board, such that the operating heat of the light-emitting piece can be quickly dissipated, which greatly enhances the heat dissipation effect of the LED lamp, and prolongs the service life of the LED lamp.

The present utility model can be used as an LED circuit board that requires to be installed with a great number of high-wattage components, and has a stable insulation effect and good heat dissipation performance.

Figure 1:
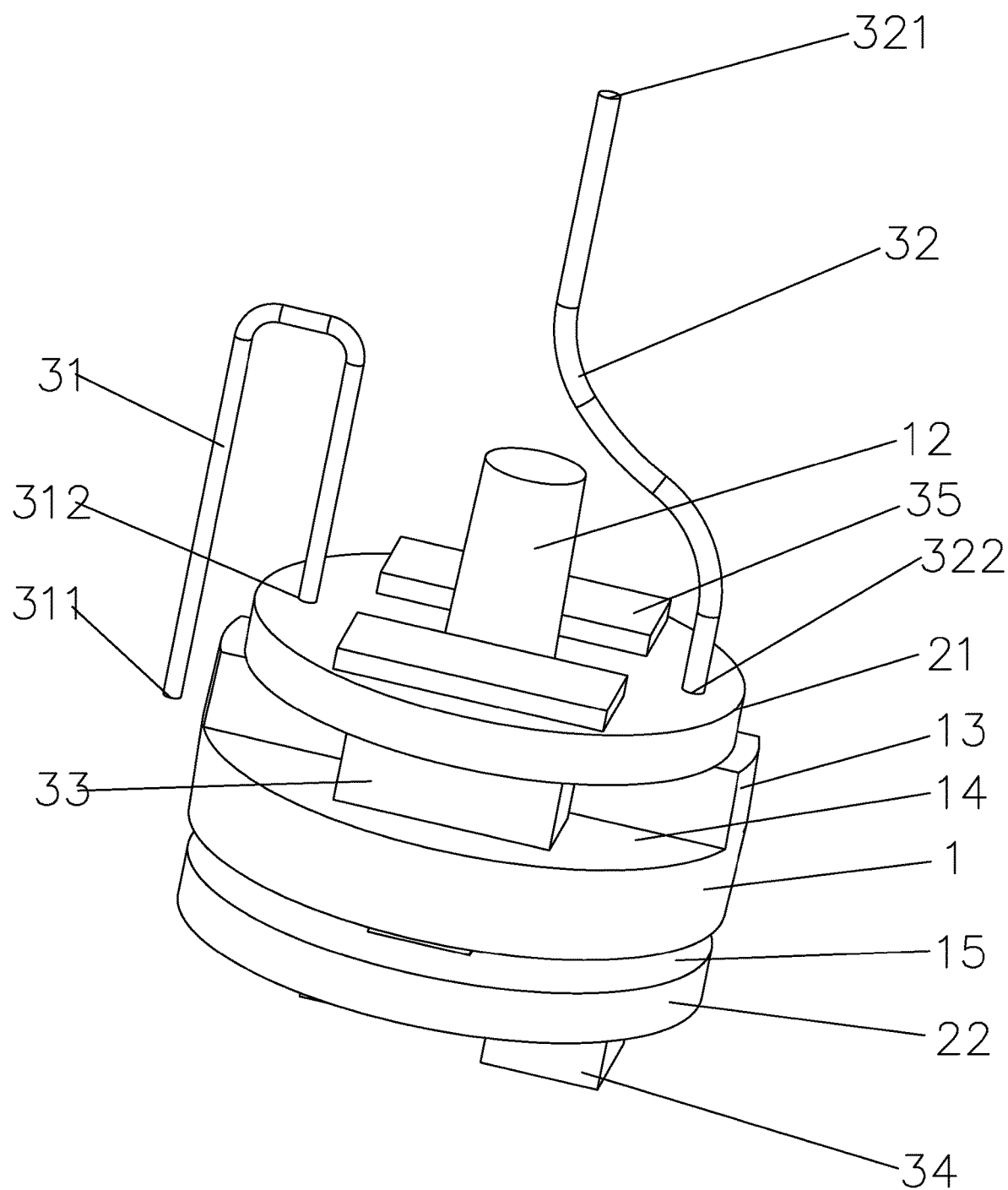
FIG. 1 is a structural schematic diagram according to the present utility model.

In the figures: insulation board 1, connecting holes 11, first connecting hole 111, second connecting hole 112, holding column 12, limiting protrusion 13, first accommodating space 14, second accommodating space 15, first circuit board 21, through hole 211, second circuit board 22, connecting columns 221, first lead 31, first power end 311, first connection end 312, second lead 32, second power end 321, second connection end 322, light-emitting piece 34, bridge rectifier 35, resistor assembly 33, lampshade 41, installation part 411, grooves 412, and lamp holder 42.

DETAILED DESCRIPTION OF THE INVENTION

The technical solution of the present utility model will be clearly and thoroughly described with reference to the drawings in an embodiment of the present utility model, wherein the described embodiment is obviously only one, but not all, of the embodiments of the present utility model. On the basis of the embodiment of the present utility model, all other embodiments obtained by those of ordinary skills in the art without inventive efforts shall fall within the protection scope of the present utility model.

Figure 2:
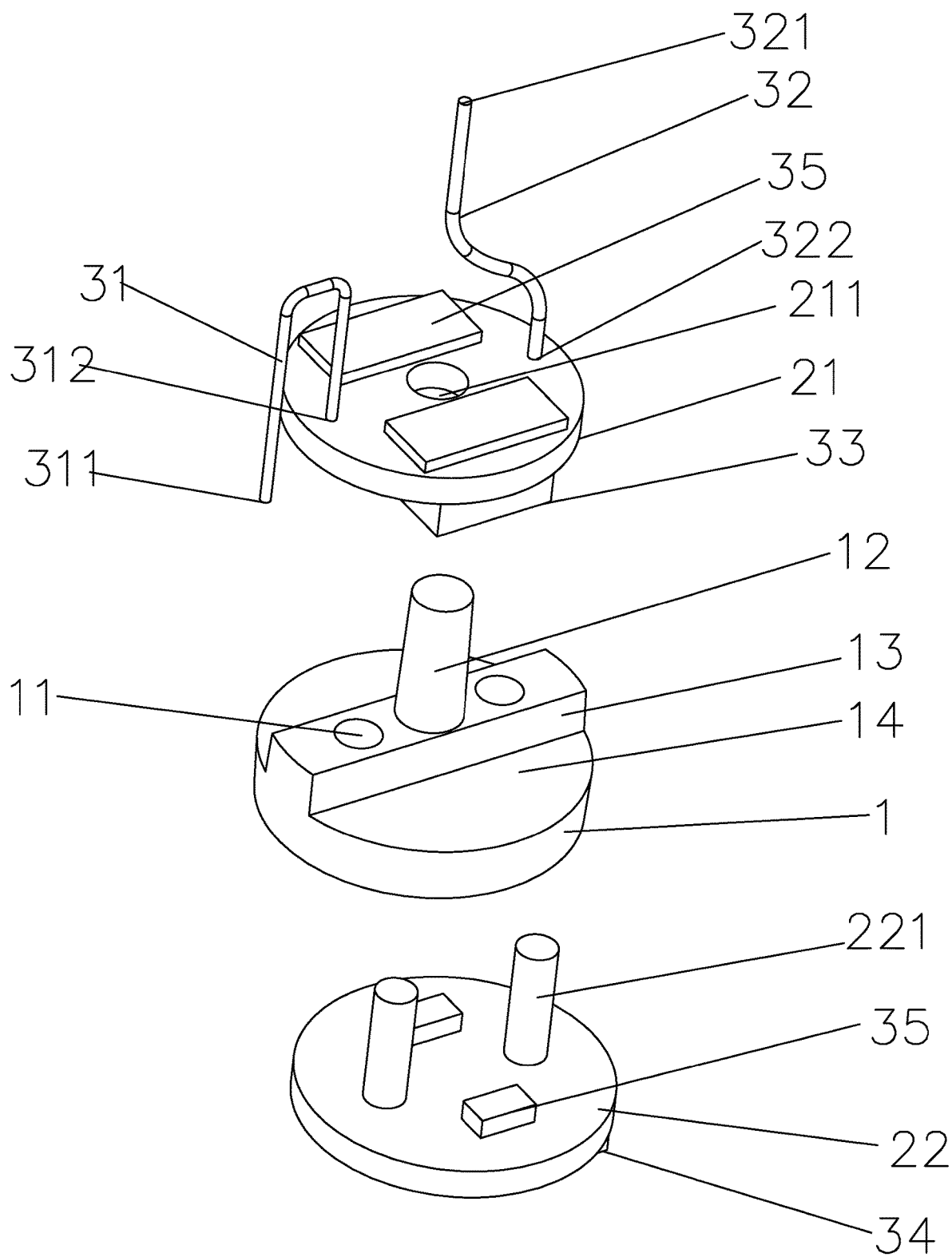
FIG. 2 is an exploded view according to the present utility model.
Figure 3:
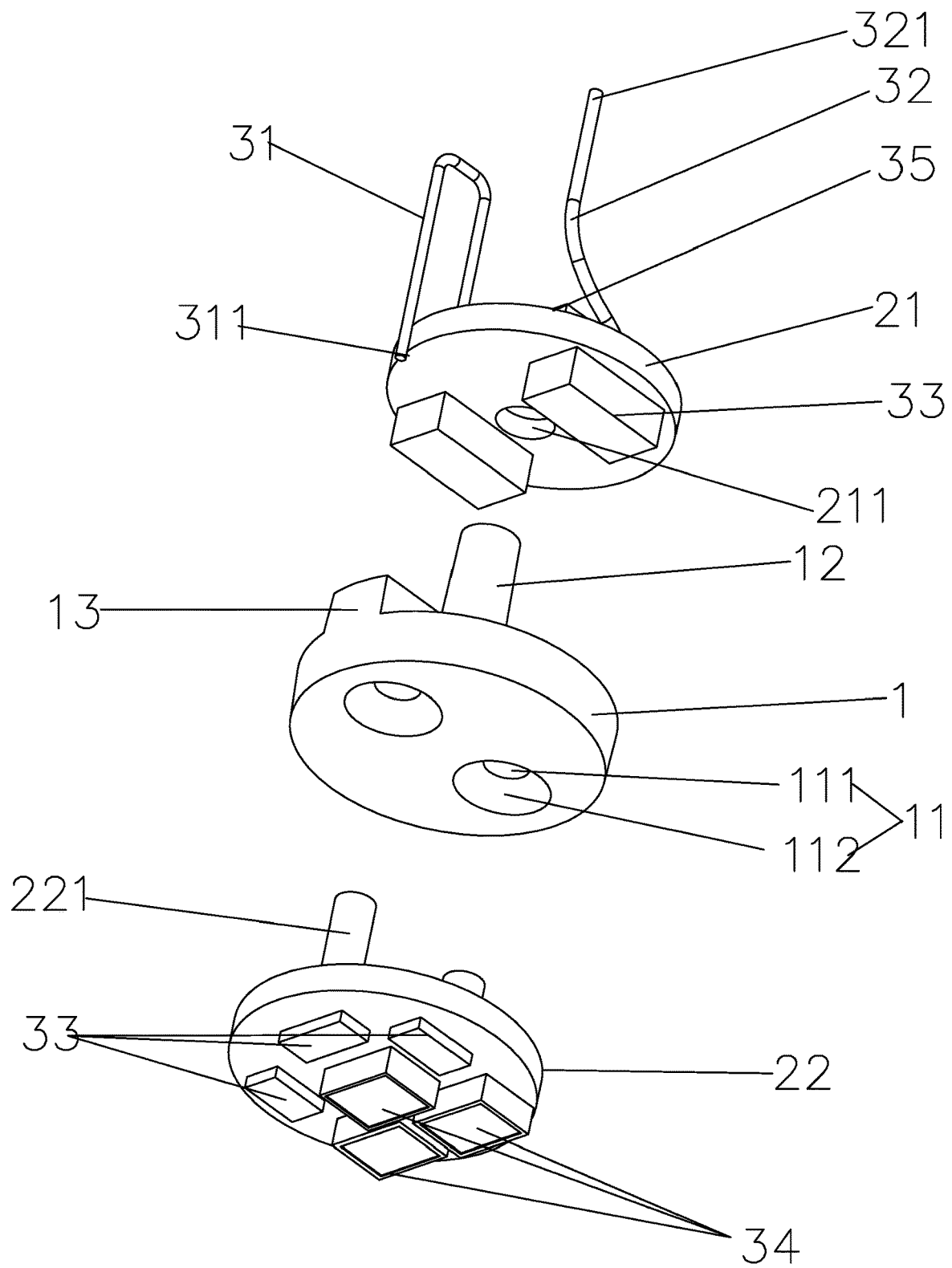
FIG. 3 is another exploded view according to the present utility model.
Figure 4:
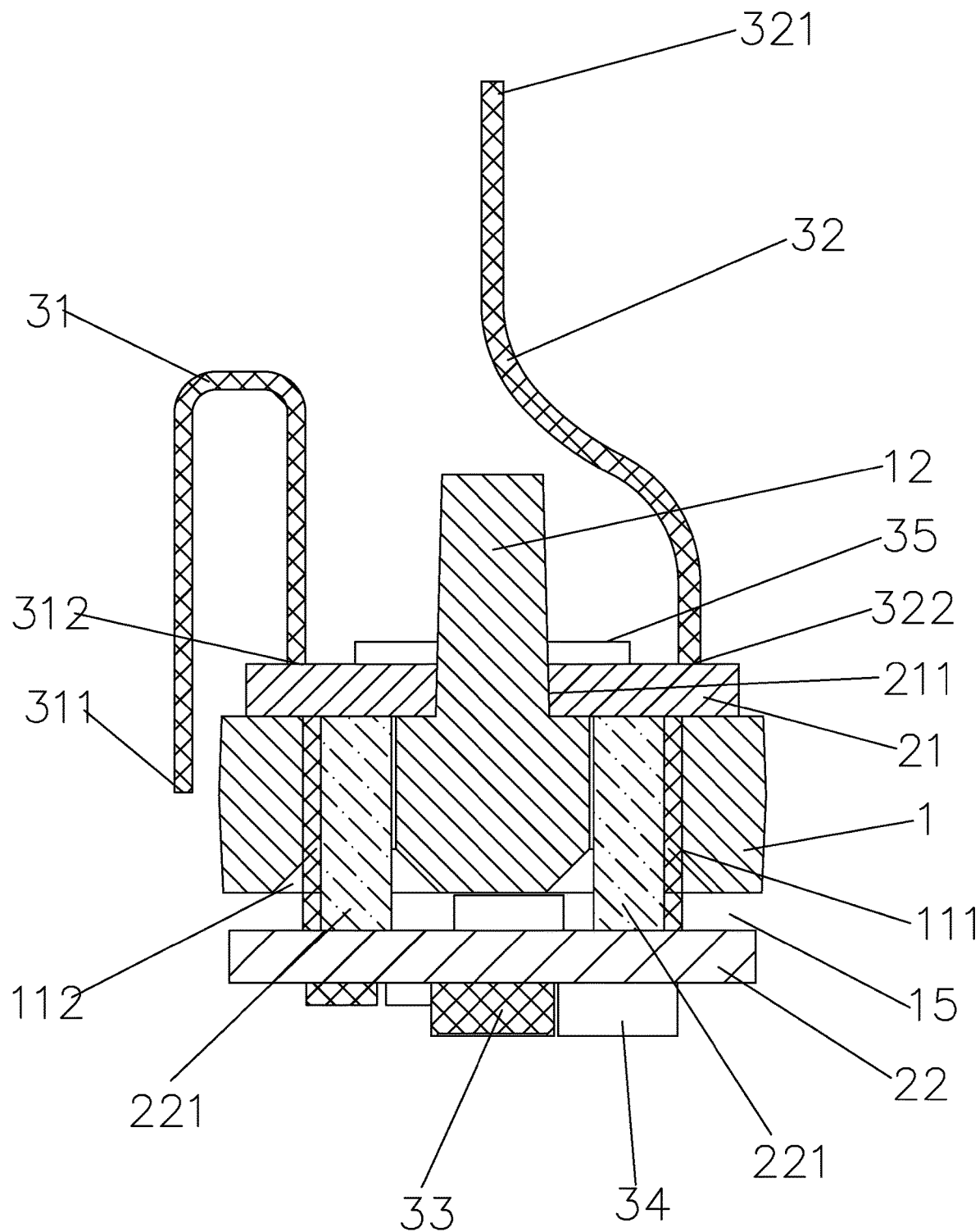
FIG. 4 is a cross-sectional view according to the present utility model.
Figure 5:
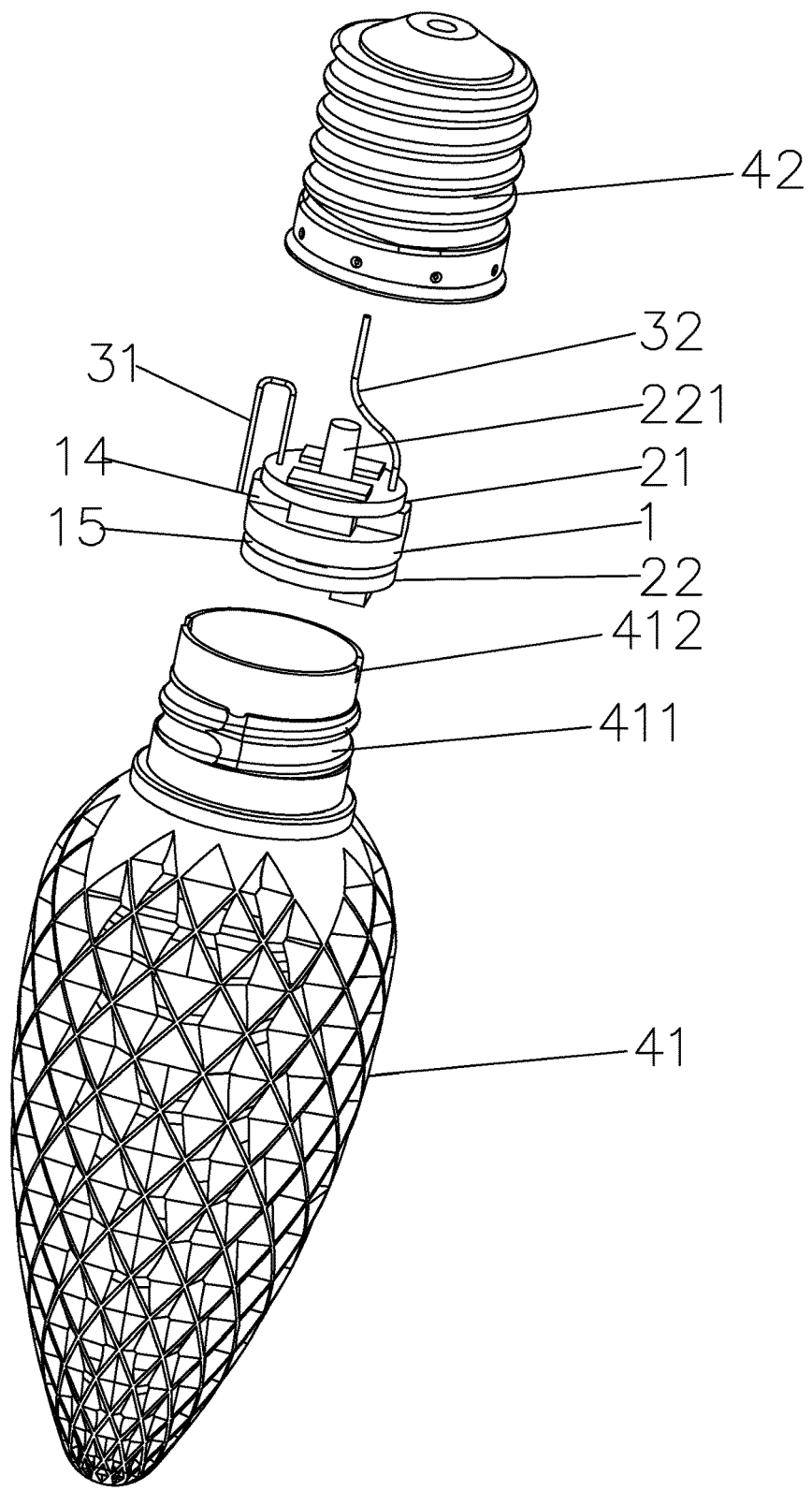
FIG. 5 is a structural schematic diagram of an LED lamp that utilizes the present utility model.

Now referring to FIGS. 1 to 5, provided is a novel LED circuit board, comprising at least two circuit boards and an insulation board 1 arranged between two adjacent circuit boards. In this embodiment, the present utility model is described in detail by using two circuit boards, specifically, a first circuit board 21 arranged above the insulation board 1 and a second circuit board 22 arranged below the insulation board 1.

The insulation board 1 is used for isolating the first circuit board 21 and the second circuit board 22. The first circuit board 21 and the second circuit board 22 are used for loading components, and are both etched with circuit patterns (not shown). The insulation board 1 prevents the first circuit board 21 and the second circuit board 22 from contacting and being electrically connected with each other, such that the operating heat of the first circuit board 21 and the operating heat of the second circuit board 22 can be prevented from being conducted to each other. Preferably, the insulation board 1 is an insulation board of a fire-retardant and fire-resistant plastic material, which is contributive to enhancing the heat dissipation performance of the present utility model, such that the thermal energy generated by the components on the first circuit board 21 and the second circuit board 22 during operation can be dissipated in time, thereby effectively prolonging the service life of the present utility model.

The insulation board 1 is provided with two connecting holes 11 arranged symmetrically and a holding column 12 arranged between the two connecting holes 11 and used for holding by hand or a robotic arm. The two connecting holes 11 pass through the insulation board 1. The first circuit board 21 is provided with a through hole 211 passing through the first circuit board 21 at a position corresponding to the holding column 12. The second circuit board 22 is provided with two connecting columns 221 extending upwards at positions corresponding to the two connecting holes 11, and the two connecting columns 221 are detachably inserted in the two connecting holes 11 respectively. The holding column 12 is detachably inserted in the through hole 211.

Preferably, the insulation board 1 is provided with a limiting protrusion 13. A first accommodating space 14 for arranging some of the components is defined by a space between a lower surface of the first circuit board 21, an upper surface of the insulation board 1, and the limiting protrusion 13. A second accommodating space 15 for arranging some of the components is defined by a space between a lower surface of the insulation board 1, an upper surface of the second circuit board 22, and the connecting columns 221 after the connecting columns 221 are inserted into the connecting holes 11. The first accommodating space 14 and the second accommodating space 15 are both in communication with an external environment to enhance the heat dissipation effect. Specifically, a height of the first accommodating space 14 is limited by a height of the limiting protrusion 13, and a height of the second accommodating space 15 is limited by fitting positions of the connecting columns 211 in the connecting holes 11.

The operating heat of the components on the first circuit board 21 and the second circuit board 22 can be dissipated to the insulation board 1 and the external environment, thereby further enhancing the heat dissipation effect. Meanwhile, the first accommodating space 14 and the second accommodating space 15 are arranged above and below the insulation board 1 respectively, thus effectively reducing the occupied space, increasing the integration level of the circuit boards, facilitating system packaging, and lowering the manufacturing cost.

It will be appreciated that the components are arranged in an embedded manner, wherein the components are arranged inside the first accommodating space 14 and/or the second accommodating space 15 and/or on a lower surface of the second circuit board 22, so as to reduce heat accumulation, enhance the heat dissipation effect of the circuit boards, and facilitate system packaging.

Preferably, both the first accommodating space 14 and the second accommodating space 15 has a regular cubic shape, which may facilitate processing, and the circuit board is usually formed by pressing the first circuit board 21, the second circuit board 22, and the insulation board 1 together. When both the first accommodating space 14 and the second accommodating space 15 are configured to have a regular cubic shape, a gap between the first circuit board 21 and the insulation board 1 and a gap between the second circuit board 22 and the insulation board 1 can form the first accommodating space 14 and the second accommodating space 15 respectively after the first circuit board 21, the second circuit board 22 and the insulation board 1 are pressed together. Accordingly, production is facilitated and production efficiency is increased.

Preferably, the connecting columns 221 are in interference fit with the connecting holes 11, wherein outer diameters of the connecting columns 221 are greater than inner diameters of the connecting holes 11, so as to facilitate fixed connection between the second circuit board 22 and the insulation board 1. Specifically, when free ends of the connecting columns 221 fitted into the connecting holes 11 are in contact with the lower surface of the first circuit board 21, the second accommodating space 15 which is of a smaller size is formed between the insulation board 1 and the second circuit board 22; when the free ends of the connecting columns 221 fitted into the connecting holes 11 are not in contact with the lower surface of the first circuit board 21, the second accommodating space 15 which has a larger size is formed between the insulation board 1 and the second circuit board 22. According to the present utility model, the fixed connection between the first circuit board 21, the insulation board 1, and the second circuit board 22 is formed through tight fitting between the connecting columns 221 and the connecting holes 11 and also the connection between the holding column 12 and the through hole 211. Users only need to assemble the three boards accordingly and then hold the holding column 12 by hand or by robotic arm to place the present utility model in a desired installation position.

Preferably, each of the connecting holes 11 comprises a first connecting hole 111 having a columnar shape which a corresponding connecting column 221 is in interference fit with; a second connecting hole 112 in a disc-shape provided at an opening of the first connecting hole 111 of each of the connecting holes 11 at an end of the first connecting hole 111 facing towards the second circuit board 22; each first connecting hole 111 is in communication with a corresponding second connecting hole 112, and each second connecting hole 112 is used for guiding and facilitating insertion of a corresponding connecting column 221 into a corresponding first connecting hole 111.

Preferably, a copper plating layer (not shown) is plated on an inner wall of each first connecting hole 111 and/or an inner wall of each second connecting hole 112. Copper has a high thermal conductivity, such that the heat of the circuit boards can be quickly dissipated through the inner wall of each first connecting hole 111 and/or the inner wall of each second connecting hole 112, thus achieving the purpose of enhancing heat dissipation effect with cost-efficiency. It will be appreciated that, without specific limitation herein, any other thermally conductive medium layer, such as a silver plating layer or a gold plating layer, may also be arranged on the inner wall of each first connecting hole 111 and/or the inner wall of each second connecting hole 112, as long as the heat conducting efficiency can be improved. During actual use and installation, the copper plating layer may cooperatively function with other heat dissipation configurations (such as the first accommodating space 14, the second accommodating space 15, and the insulation board 1) to accelerate heat dissipation of an area in concern, thereby quickly dissipating the operating heat of the circuit boards and prolonging the service life of the circuit boards.

Furthermore, the connecting columns 221 are aluminum heat dissipation columns or tin heat dissipation columns, when the free ends of the connecting columns 221 are in contact with the lower surface of the first circuit board 21, the first circuit board 21 and the second circuit board 22 are electrically connected to each other due to electric conductivity of the aluminum heat dissipation columns or the tin heat dissipation columns with the lower surface of the first circuit board 21; when the free ends of the connecting columns 221 are not in contact with the lower surface of the first circuit board 21, leads (described in detail below) are required for connection to ensure that the first circuit board 21 and the second circuit board 22 are electrically connected to each other.

Furthermore, the components include a first lead 31, a second lead 32, at least one light-emitting piece 34, and a voltage-dividing circuit; the voltage-dividing circuit comprises bridge rectifiers 35 and a resistor assembly 33; the first lead 31 comprises a first power end 311 connected to a power supply and a first connection end 312 connected to the first circuit board 21; the second lead 32 comprises a second power end 321 connected to the power supply and a second connection end 322 connected to the first circuit board 21; said at least one light-emitting piece 34 is arranged on the lower surface of the second circuit board 22, and is electrically connected to the second circuit board 22.

Preferably, said at least one light-emitting piece 34 is a surface mount LED chip, and the LED chip is welded on the lower surface of the second circuit board 22.

In use (referring to FIG. 5): the present utility model embodied as above is arranged in an LED lamp. The LED lamp comprises a lampshade 41 and a lamp holder 42 fixedly connected to the lampshade 41, wherein the lampshade 41 comprises a shade body and an installation part 411 integrally connected to the shade body, the installation part 411 is inserted in the lamp holder 42, and the present utility model is inserted in the installation part 411. Specifically, through an interference fit between an outer wall of the insulation board 1 and an inner wall of the installation part 411, fixed connection between the present utility model and the installation part 411 is achieved.

Furthermore, the installation part 411 is provided with an inner hole for communicating an inner cavity of the shade body with an external space of the shade body, and the second circuit board 22 is arranged on a side of the installation part facing the shade body.

Furthermore, an end of the installation part 411 opposite to the shade body is provided with two grooves 412 symmetrically arranged, and each of the two grooves 412 has a width extending along a circumference of the installation part 411 to facilitate holding of the present utility model by hand or by robotic arm and install or uninstall the present utility model.

By adopting the above technical solutions, the beneficial effects of the present utility model are as follows:

1. A multi-layer design structure is adopted, which can increase the loading area of the circuit board structure, thereby increasing the number of components that can be loaded on the circuit board structure.

2. By arranging a fire-retardant and fire-resistant plastic material insulation board 1 between two adjacent circuit boards, the operating heat of the components of the first circuit board 21 and the operating heat of the components of the second circuit board 22 can be prevented from being conducted to each other, such that the components arranged on the two circuit boards will not affect each other.

3. Since accommodating spaces for arranging the components are configured between the first circuit board 21 and the insulation board 1 and between the second circuit board 22 and the insulation board 1 respectively, and the accommodating spaces are in communication with the external environment, the operating heat of the components arranged in the accommodating spaces can be quickly dissipated, which greatly enhances the heat dissipation effect of the LED lamp, and prolongs the service life of the LED lamp.

4. The light-emitting piece 34 is connected with the second circuit board 22, such that the operating heat of the light-emitting piece 34 can be quickly dissipated, which greatly enhances the heat dissipation effect of the LED lamp, and prolongs the service life of the LED lamp.

The present utility model can be used as an LED circuit board that requires to be installed with a great number of high-wattage components, and has a stable insulation effect and good heat dissipation performance.

Although embodiments of the present utility model have been illustrated and described, it should be understood that changes, modifications, substitutions, and alterations can be made to such embodiments by those of ordinary skills in the art without departing from the principle and essence of the present utility model, and the scope of the present utility model is limited by the appended claims and equivalents.

What is claimed is:

1. An LED circuit board, comprising at least two circuit boards and an insulation board arranged between two adjacent circuit boards; electronic components are loaded on said at least two circuit boards; said at least two circuit boards comprises a first circuit board disposed above the insulation board and a second circuit board disposed below the insulation board; the insulation board is provided with two connecting holes arranged symmetrically and a holding column arranged between the two connecting holes for convenience of holding; the first circuit board is provided with a through hole passing through the first circuit board at a position corresponding to the holding column; the second circuit board is provided with two connecting columns extending upwards at positions corresponding to the two connecting holes, and the two connecting columns are detachably inserted in the two connecting holes respectively; the holding column is detachably inserted in the through hole; the insulation board is made of fire-retardant and fire-resistant plastic material.

2. The LED circuit board of claim 1, wherein the insulation board is provided with a limiting protrusion; a first accommodating space in which some of the electronic components are disposed is defined by a space between a lower surface of the first circuit board, an upper surface of the insulation board, and the limiting protrusion; the first accommodating space is in communication with an external environment.

3. The LED circuit board of claim 1, wherein the connecting columns are in interference fit with the connecting holes; outer diameters of the connecting columns are greater than inner diameters of the connecting holes.

4. The LED circuit board of claim 3, wherein a second accommodating space in which some of the electronic components are disposed is defined by a space between a lower surface of the insulation board, an upper surface of the second circuit board, and the connecting columns after the connecting columns are inserted into the connecting holes; the second accommodating space is in communication with an external environment.

5. The LED circuit board of claim 3, wherein each of the connecting holes comprises a first connecting hole having a columnar shape which a corresponding connecting column is in interference fit with; a second connecting hole in a disc-shape is provided at an opening of the first connecting hole of each of the connecting holes at an end of the first connecting hole facing towards the second circuit board; each first connecting hole is in communication with a corresponding second connecting hole.

6. The LED circuit board of claim 5, wherein a copper plating layer is plated on an inner wall of each first connecting hole and/or an inner wall of each second connecting hole.

7. The LED circuit board of claim 1, wherein the connecting columns are aluminum heat dissipation columns or tin heat dissipation columns.

8. The LED circuit board of claim 1, wherein the electronic components comprise a first lead, a second lead, at least one light-emitting piece, and a voltage-dividing circuit; the voltage-dividing circuit comprises bridge rectifiers and a resistor assembly; the first lead comprises a first power end configured to be connected with a power supply, and a first connection end connected to the first circuit board; the second lead comprises a second power end configured to be connected to the power supply, and a second connection end connected to the first circuit board; said at least one light-emitting piece is arranged on a lower surface of the second circuit board, and is electrically connected to the second circuit board.

9. The LED circuit board of claim 8, wherein said at least one light-emitting piece is a surface mount LED chip, and the LED chip is welded on the lower surface of the second circuit board.

* * * * *